（12）United States Patent
Shimanouchi

(10) Patent No.: US 9,621,125 B2
(45) Date of Patent: Apr. 11, 2017

(54) VARIABLE CAPACITANCE CIRCUIT AND IMPEDANCE MATCHING CIRCUIT

(71) Applicant: FUJITSU LIMITED, Kawasaki-shi, Kanagawa (JP)

(72) Inventor: Takeaki Shimanouchi, Akashi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/621,528

(22) Filed: Feb. 13, 2015

(65) Prior Publication Data

US 2015/0162889 A1   Jun. 11, 2015

Related U.S. Application Data

(63) Continuation of application No. PCT/JP2012/073070, filed on Sep. 10, 2012.

(51) Int. Cl.
*H03H 7/38* (2006.01)
*H01G 15/00* (2013.01)
(Continued)

(52) U.S. Cl.
CPC ............ *H03H 7/38* (2013.01); *H01G 5/16* (2013.01); *H01G 5/38* (2013.01); *H01G 15/00* (2013.01)

(58) Field of Classification Search
CPC .. H01G 5/16; H01G 5/38; H01G 5/40; H01G 15/00; H03H 7/38
(Continued)

(56) References Cited

U.S. PATENT DOCUMENTS

| 7,319,580 B2 | 1/2008 | Chou |
| 2002/0025595 A1* | 2/2002 | Xu .................. H01H 59/0009 438/48 |

(Continued)

FOREIGN PATENT DOCUMENTS

| EP | 1 864 307 | 12/2007 |
| EP | 2 093 778 A1 | 8/2009 |

(Continued)

OTHER PUBLICATIONS

International Search Report and Written Opinion of the International Searching Authority (Form PCT/ISA/237) with a partial translation(Box No. V), mailed in connection with PCT/JP2012/073070 and mailed Nov. 27, 2012 (7 pages).

(Continued)

*Primary Examiner* — Stephen E Jones
*Assistant Examiner* — Scott S Outten
(74) *Attorney, Agent, or Firm* — Fujitsu Patent Center

(57) ABSTRACT

A first variable capacitance section included in a variable capacitance circuit includes a plurality of first variable capacitance elements connected to a signal line and each having a first capacitance value or a second capacitance value greater than the first capacitance value according to driving voltage, and includes a first fixed capacitance element connected in series with the plurality of first variable capacitance elements. A second variable capacitance section included in the variable capacitance circuit includes a second variable capacitance element connected to the signal line and having the first capacitance value or the second capacitance value according to the driving voltage, and includes a second fixed capacitance element connected in series with the second variable capacitance element.

10 Claims, 10 Drawing Sheets

(51) Int. Cl.
*H01G 5/16* (2006.01)
*H01G 5/38* (2006.01)

(58) Field of Classification Search
USPC .......................................................... 333/32
See application file for complete search history.

(56) References Cited

U.S. PATENT DOCUMENTS

| | | | |
|---|---|---|---|
| 2003/0020559 A1* | 1/2003 | Stewart | H03H 7/38 333/32 |
| 2004/0183626 A1* | 9/2004 | Kang | H01P 1/2056 333/207 |
| 2006/0226501 A1 | 10/2006 | Allen Chou | |
| 2009/0207549 A1 | 8/2009 | Shimanouchi et al. | |
| 2009/0323252 A1 | 12/2009 | Nishiyama | |
| 2010/0142117 A1 | 6/2010 | Shimanouchi et al. | |
| 2010/0254068 A1 | 10/2010 | Shimanouchi et al. | |
| 2010/0308933 A1* | 12/2010 | See | H03F 1/565 333/32 |
| 2011/0096462 A1 | 4/2011 | Shimanouchi et al. | |

FOREIGN PATENT DOCUMENTS

| | | |
|---|---|---|
| EP | 2 096 650 A1 | 9/2009 |
| JP | 63-204806 | 8/1988 |
| JP | 2007-143376 | 6/2007 |
| JP | 2008-130613 A | 6/2008 |
| JP | 2008-159661 A | 7/2008 |
| JP | 2008-536308 A | 9/2008 |
| JP | 2009-200157 A | 9/2009 |
| JP | 2010-135614 A | 6/2010 |
| JP | 2010-245276 A | 10/2010 |
| JP | 2011-096726 A | 5/2011 |
| JP | 2012-023273 A | 2/2012 |
| WO | 2006/105031 A1 | 10/2006 |
| WO | 2008/075613 A1 | 6/2008 |

OTHER PUBLICATIONS

JPOA—Office Action mailed Aug. 16, 2016 for corresponding Japanese Application No. 2014-534142, with English translation of relevant part: p. 1 line 19 to p. 2 line 35; and p. 3 line 31 to line 34.

* cited by examiner

VARIABLE CAPACITANCE CIRCUIT AND IMPEDANCE MATCHING CIRCUIT

CROSS-REFERENCE TO RELATED APPLICATION

This application is a continuation application of International Application PCT/JP2012/073070 filed on Sep. 10, 2012 which designated the U.S., the entire contents of which are incorporated herein by reference.

FIELD

The embodiment discussed herein is related to a variable capacitance circuit and an impedance matching circuit.

BACKGROUND

A variable capacitance element using an electrostatic actuator is an electronic part in which the MEMS (Micro Electro Mechanical System) technique is used.

A variable capacitance element using an electrostatic actuator includes, for example, a fixed electrode and a dielectric layer laminated over a substrate and a movable electrode arranged over a surface opposite the fixed electrode with an air layer therebetween. The movable electrode is elastically supported over the substrate with an anchor. When a potential difference arises between the fixed electrode and the movable electrode by an external power supply, electrostatic attraction causes a change in the distance between the fixed electrode and the movable electrode. As a result, electrostatic capacity changes.

With a digital variable capacitance element (having two capacitance values according to driving voltage), minimum capacity is obtained in a state in which a fixed electrode and a movable electrode are separate from each other (OFF state). On the other hand, maximum capacity is obtained in a state in which a fixed electrode and a movable electrode are touching with a dielectric therebetween (ON state).

Japanese Laid-open Patent Publication No. 2008-130613
Japanese Laid-open Patent Publication No. 2010-135614

With plural-bit variable capacitance circuits in which each bit includes the above digital variable capacitance element and a fixed capacitance element, capacitance values in a determined range are obtained with resolution corresponding to a bit number by adjusting the value of a fixed capacitance element of each bit. With plural-bit variable capacitance circuits, however, a capacitance value of a fixed capacitance element of a high order bit becomes larger than a capacitance value of a fixed capacitance element of a low order bit in order to obtain a greater change in capacity. If a fixed capacitance element of each bit includes a dielectric of the same thickness, then the electrode area of the fixed capacitance element of the high order bit becomes larger. As a result, circuit area increases.

SUMMARY

According to an aspect, there is provided a variable capacitance circuit which includes a first variable capacitance section including a plurality of first variable capacitance elements connected to a signal line and each having a first capacitance value or a second capacitance value greater than the first capacitance value according to driving voltage and a first fixed capacitance element connected in series with the plurality of first variable capacitance elements and which includes a second variable capacitance section including a second variable capacitance element connected to the signal line and having the first capacitance value or the second capacitance value according to the driving voltage and a second fixed capacitance element connected in series with the second variable capacitance element.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
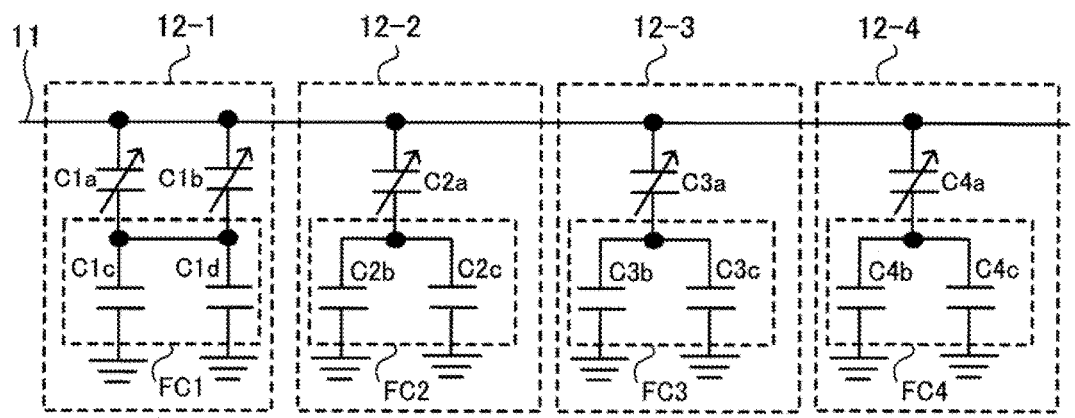
FIG. 1 is a circuit diagram of an example of a variable capacitance circuit according to an embodiment.

An embodiment will now be described with reference to the accompanying drawings, wherein like reference numerals refer to like elements throughout.

A variable capacitance circuit according to an embodiment realizes capacitance values in a determined range with n-bit (n≥2) resolution and includes n variable capacitance sections each of which specifies a capacitance value of a bit. In the following example, a case where n=4 will be described. However, resolution is not limited to 4 bits.

FIG. 1 is a circuit diagram of an example of a variable capacitance circuit according to an embodiment.

A variable capacitance circuit 10 illustrated in FIG. 1 realizes capacitance values in a determined range with 4-bit resolution. That is to say, capacitance values in a determined range are represented by 16 values from "0000" to "1111".

The variable capacitance circuit 10 includes four variable capacitance sections 12-1, 12-2, 12-3, and 12-4 connected to a signal line 11. The variable capacitance section 12-1 specifies a capacitance value of a most significant bit (MSB) and the variable capacitance section 12-4 specifies a capacitance value of a least significant bit (LSB).

The variable capacitance section 12-1 which specifies a capacitance value of the MSB includes variable capacitance elements C1a and C1b connected to the signal line 11 and a fixed capacitance element FC1 connected in series with the variable capacitance elements C1a and C1b.

The variable capacitance section 12-2 which specifies a capacitance value of a bit one bit lower than the MSB includes a variable capacitance element C2a connected to the signal line 11 and a fixed capacitance element FC2 connected in series with the variable capacitance element C2a.

The structure of a circuit included in each of the variable capacitance section 12-3 which specifies a capacitance value of a bit one bit higher than the LSB and the variable capacitance section 12-4 which specifies a capacitance value of the LSB is the same as that of the circuit included in the variable capacitance section 12-2. That is to say, the variable capacitance section 12-3 includes a variable capacitance element C3a and a fixed capacitance element FC3 and the variable capacitance section 12-4 includes a variable capacitance element C4a and a fixed capacitance element FC4.

Each of the variable capacitance elements C1a, C1b, C2a, C3a, and C4a has two capacitance values according to driving voltage. For example, when driving voltage is not applied, each variable capacitance element has a first capacitance value. When driving voltage is applied, each variable capacitance element has a second capacitance value greater than the first capacitance value.

With the variable capacitance circuit 10 illustrated in FIG. 1, the fixed capacitance element FC1 included in the variable capacitance section 12-1 includes two fixed capacitance elements C1c and C1d connected in parallel. One terminal of each of the fixed capacitance elements C1c and C1d is connected to the variable capacitance elements C1a and C1b and the other terminal of each of the fixed capacitance elements C1c and C1d is grounded. The fixed capacitance element FC2 included in the variable capacitance section 12-2 includes two fixed capacitance elements C2b and C2c connected in parallel.

One terminal of each of the fixed capacitance elements C2b and C2c is connected to the variable capacitance element C2a and the other terminal of each of the fixed capacitance elements C2b and C2c is grounded. The structure of a circuit included in each of the fixed capacitance elements FC3 and FC4 included in the variable capacitance sections 12-3 and 12-4, respectively, is the same as that of the circuit included in the fixed capacitance element FC2. That is to say, the fixed capacitance element FC3 includes fixed capacitance elements C3b and C3c and the fixed capacitance element FC4 includes fixed capacitance elements C4b and C4c.

Figure 2:
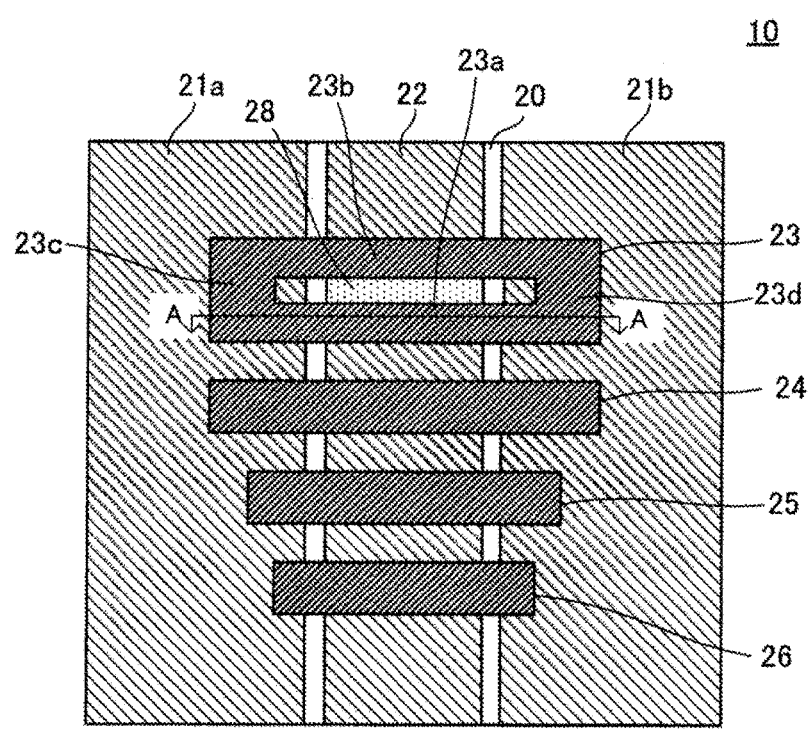
FIG. 2 is a plan view of an example of the variable capacitance circuit according to the embodiment.

FIG. 2 is a plan view of an example of the variable capacitance circuit according to the embodiment.

Figure 3:
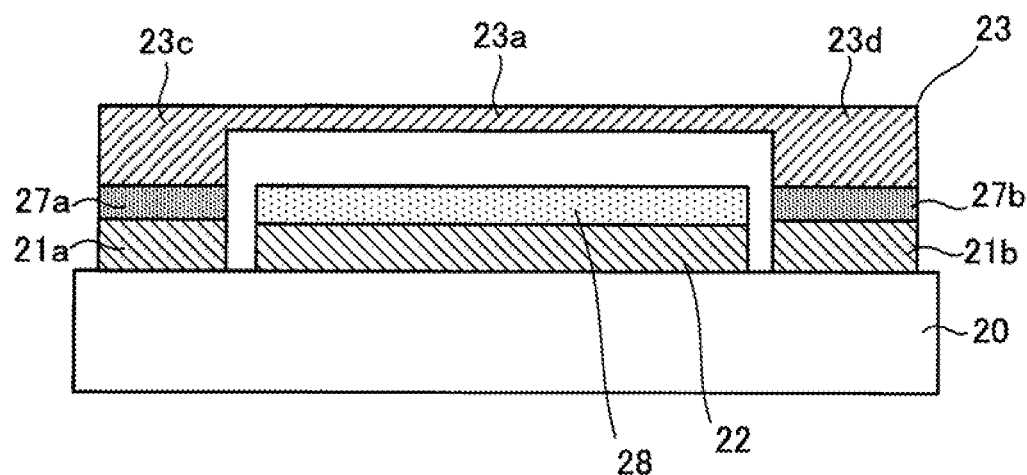
FIG. 3 is a sectional view taken along lines A-A of FIG. 2.

FIG. 3 is a sectional view taken along lines A-A of FIG. 2.

Figure 4:
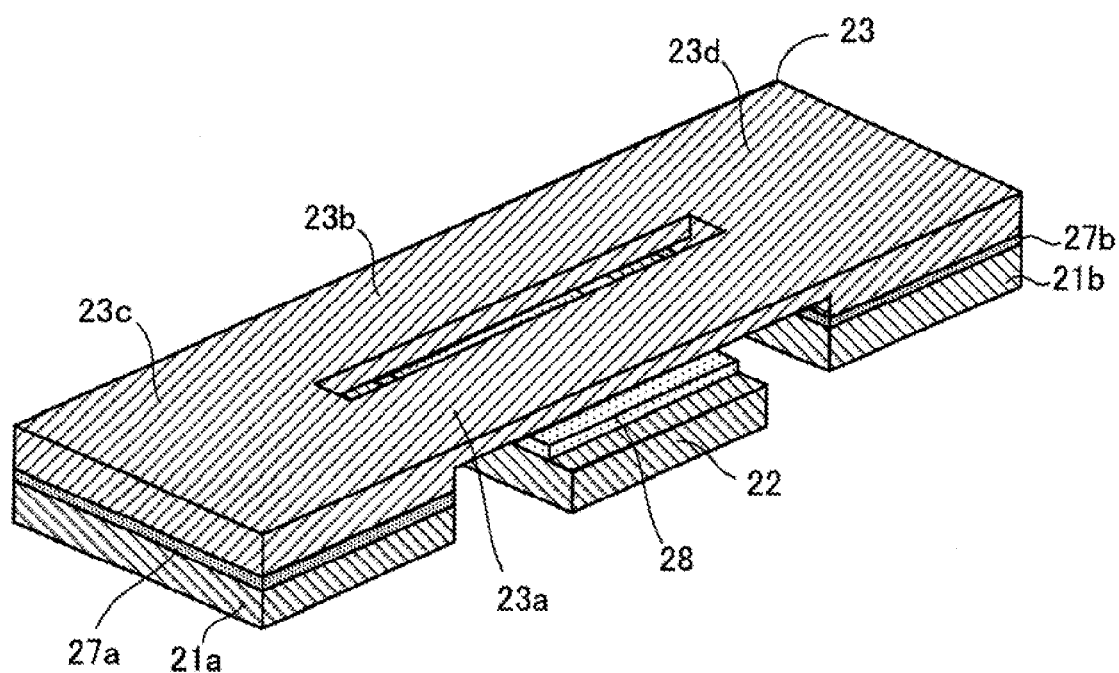
FIG. 4 is a perspective view of a variable capacitance section which specifies a capacitance value of a MSB.

FIG. 4 is a perspective view of the variable capacitance section which specifies a capacitance value of the MSB.

In the variable capacitance circuit 10, ground layers 21a and 21b and a signal line 22 are formed over a substrate 20. Furthermore, electrodes 23, 24, 25, and 26 are formed so that they will extend over the signal line 22.

The electrode 23 belongs to the variable capacitance section 12-1 illustrated in FIG. 1, the electrode 24 belongs to the variable capacitance section 12-2 illustrated in FIG. 1, the electrode 25 belongs to the variable capacitance section 12-3 illustrated in FIG. 1, and the electrode 26 belongs to the variable capacitance section 12-4 illustrated in FIG. 1.

As illustrated in FIGS. 3 and 4, the electrode has a shape like a bridge and includes movable electrode portions 23a and 23b and fixed electrode portions 23c and 23d. The movable electrode portions 23a and 23b function as movable electrodes of the variable capacitance elements C1a and C1b included in the variable capacitance section 12-1 illustrated in FIG. 1. The fixed electrode portions 23c and 23d function as movable electrodes of the fixed capacitance elements C1c and C1d included in the variable capacitance section 12-1. The movable electrode portions 23a and 23b are supported elastically by the fixed electrode portions 23c and 23d. By adopting this structure, the variable capacitance elements C1a and C1b and the fixed capacitance elements C1c and C1d are arranged efficiently and space-saving is realized.

The fixed electrode portions 23c and 23d are fixed to the ground layers 21a and 21b with dielectrics 27a and 27b, respectively, therebetween. Furthermore, a dielectric 28 is formed over the signal line 22 and under the movable electrode portions 23a and 23b. In the example of FIG. 2, one dielectric 28 is formed under the movable electrode portions 23a and 23b. However, the number of dielectrics 28 formed may correspond to that of the movable electrode portions 23a and 23b. In that case, it is desirable to use the same material for forming the dielectrics 28 and to make them equal in thickness.

The fixed capacitance elements C1c and C1d included in the variable capacitance section 12-1 illustrated in FIG. 1 are realized by the fixed electrode portions 23c and 23d, the dielectrics 27a and 27b, and the ground layers 21a and 21b respectively. Furthermore, the two variable capacitance elements C1a and C1b included in the variable capacitance section 12-1 illustrated in FIG. 1 are realized by the movable electrode portions 23a and 23b, respectively, the dielectric 28 formed under the movable electrode portions 23a and 23b, and the signal line 22 (which functions as fixed electrodes).

Each of the electrodes 24 through 26 also has a shape like a bridge (not illustrated). With each of the electrodes 24 through 26, both edge portions are fixed electrode portions and are fixed to the ground layers 21a and 21b with the dielectrics 27a and 27b, respectively, therebetween. A dielectric is formed over the signal line 22 and under movable electrode portions elastically supported by the fixed electrode portions.

For example, a glass substrate with a thickness of about 300 to 500 μm or a silicon (Si) substrate with a thickness of about 300 to 500 μm over which quartz ($SiO_2$) with a thickness of about 1 to 3 μm is formed is used as the substrate 20. For example, aluminum (Al) or gold (Au) with a thickness of about 1 to 3 μm is used as the ground layers 21a and 21b and the signal line 22. For example, Al with a thickness of about 0.5 to 3 μm is used as the electrodes 23 through 26. For example, $SiO_2$ with a thickness of about 0.2 to 1 μm is used as the dielectrics 27a and 27b. For example, alumina ($Al_2O_3$) with a thickness of about 0.1 to 0.5 μm is used as the dielectric 28.

Determined driving voltage is applied to the electrodes 23 through 26 independently of one another.

Figure 5:
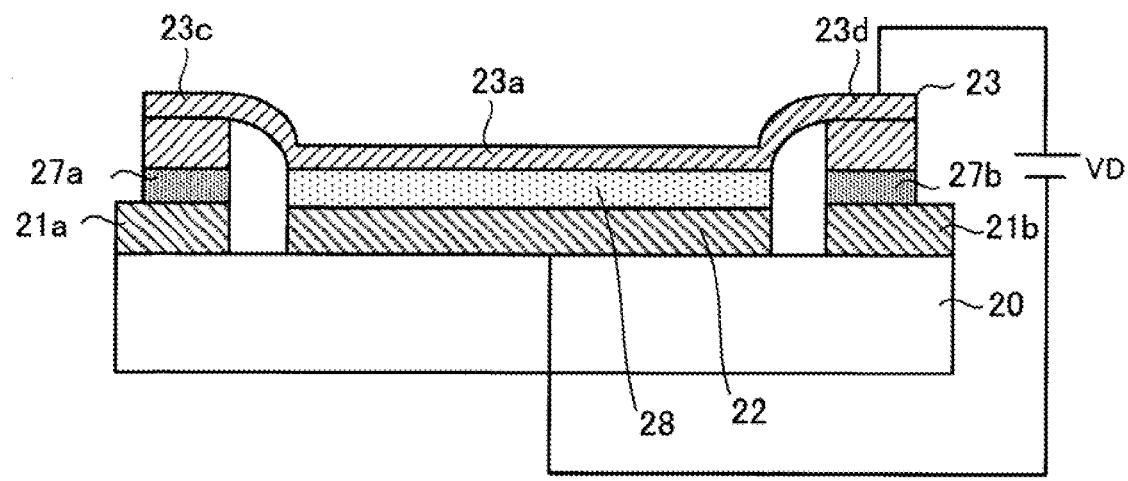
FIG. 5 illustrates the state of a movable electrode portion at the time of the application of driving voltage.

FIG. 5 illustrates the state of the movable electrode portion at the time of the application of driving voltage. FIG. 5 illustrates the movement of the movable electrode portion 23a illustrated in FIG. 3 which is a sectional view.

Driving voltage is applied between the electrode 23 and the signal line 22 by a power supply VD. A negative side of the power supply VD is connected to the signal line 22. As illustrated in FIG. 5, when driving voltage is applied, a state in which the signal line 22, which is a fixed electrode, and the movable electrode portion 23a touch with the dielectric 28 therebetween arises due to electrostatic attraction. The movable electrode portion 23b also moves simultaneously by the same driving voltage and touches the dielectric 28 (not illustrated). At this time each of the variable capacitance elements C1a and C1b has the maximum capacitance value. A capacitance value obtained at this time will be referred to as an ON-state capacitance value.

On the other hand, when driving voltage is not applied and the movable electrode portions 23a and 23b are separate from the signal line 22, each of the variable capacitance elements C1a and C1b has the minimum capacitance value. A capacitance value obtained at this time will be referred to as an OFF-state capacitance value.

If the variable capacitance elements C1a and C1b are driven by the same driving voltage, there is no need to prepare two power supplies. That is to say, one power supply will suffice.

The relationship between electrostatic attraction F and driving voltage V is represented by $$F=(S/2d^2)\in V^2 \tag{1}$$

where S is the facing area of the movable electrode portion 23a or 23b and the fixed electrode, d is inter-electrode distance, and c is the permittivity of the dielectric 28.

The facing area is, for example, about 5000 (50 μm×100 μm, for example) to 30000 μm² (150 μm×200 μm, for example). The inter-electrode distance d is, for example, about 0.5 to 2 μm.

The movable electrode portions 23a and 23b have the same spring constant so that they will deform in the same manner at the same driving voltage. Furthermore, the inter-electrode distance between the movable electrode portion 23a and the fixed electrode (signal line 22) and the inter-electrode distance between the movable electrode portion 23b and the fixed electrode (signal line 22) are the same so that the variable capacitance elements C1a and C1b will have the same capacitance value at the same driving voltage. Similarly, the facing area of the movable electrode portion 23a and the fixed electrode (signal line 22) and the facing area of the movable electrode portion 23b and the fixed electrode (signal line 22) are the same so that the variable capacitance elements C1a and C1b will have the same capacitance value at the same driving voltage.

This makes it possible to make the two variable capacitance elements C1a and C1b touch or separate from the dielectric 28 at the same time by the use of one power supply.

The facing area S is set mainly on the basis of the ON-state capacitance value. Furthermore, the inter-electrode distance d is set mainly on the basis of the OFF-state capacitance value and driving voltage.

The electrode 24 through 26 move in the same manner according to driving voltage.

With the variable capacitance circuit 10 according to the embodiment the variable capacitance section 12-1 which specifies a capacitance value of the MSB includes the variable capacitance elements C1a and C1b. Accordingly, circuit area is significantly small compared with a case where each of variable capacitance sections which specify capacitance values of all bits includes one variable capacitance element.

The reason for this is as follows.

Figure 6:
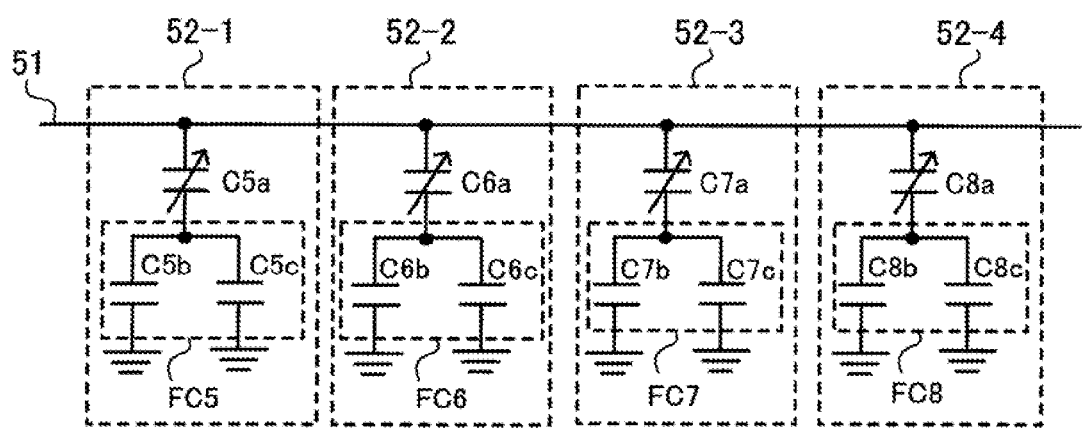
FIG. 6 is a circuit diagram of a variable capacitance circuit in which each of variable capacitance sections that specify capacitance values of all bits includes one variable capacitance element.

FIG. 6 is a circuit diagram of a variable capacitance circuit in which each of variable capacitance sections that specify capacitance values of all bits includes one variable capacitance element.

A variable capacitance circuit 50 illustrated in FIG. 6 includes four variable capacitance sections 52-1, 52-2, 52-3, and 52-4 connected to a signal line 51. The variable capacitance section 52-1 specifies a capacitance value of a MSB and the variable capacitance section 52-4 specifies a capacitance value of a LSB.

The variable capacitance section 52-1 includes a variable capacitance element C5a connected to the signal line 51 and a fixed capacitance element FC5 connected in series with the variable capacitance element C5a. Similarly, the variable capacitance section 52-2 includes a variable capacitance element C6a connected to the signal line 51 and a fixed capacitance element FC6 connected in series with the variable capacitance element C6a. The variable capacitance section 52-3 includes a variable capacitance element C7a connected to the signal line 51 and a fixed capacitance element FC7 connected in series with the variable capacitance element C7a. The variable capacitance section 52-4 includes a variable capacitance element C8a connected to the signal line 51 and a fixed capacitance element FC8 connected in series with the variable capacitance element C8a.

The fixed capacitance element FC5 includes fixed capacitance elements C5b and C5c connected in parallel.

The structure of a circuit included in each of the fixed capacitance elements FC6 through FC8 is the same as that of the circuit included in the fixed capacitance element FC5. That is to say, the fixed capacitance elements FC6 through FC8 include fixed capacitance elements C6b and C6c, fixed capacitance elements C7b and C7c, and fixed capacitance elements C8b and C8c respectively.

Unlike the variable capacitance circuit 10 according to the embodiment illustrated in FIG. 1, the variable capacitance section 52-1 of the variable capacitance circuit 50 which specifies a capacitance value of the MSB includes the one variable capacitance element C5a.

An example of setting a capacitance value in the state of each bit to obtain capacitance values in the range of about 0.1 to 5.0 pF with 4-bit resolution in the variable capacitance circuit 50 having the above structure is as follows. However, it is assumed that an ON-state capacitance value and an OFF-state capacitance value of each of the variable capacitance elements C5a, C6a, C7a, and C8a are 3.0 pF and 0.03 pF respectively.

Figure 7:
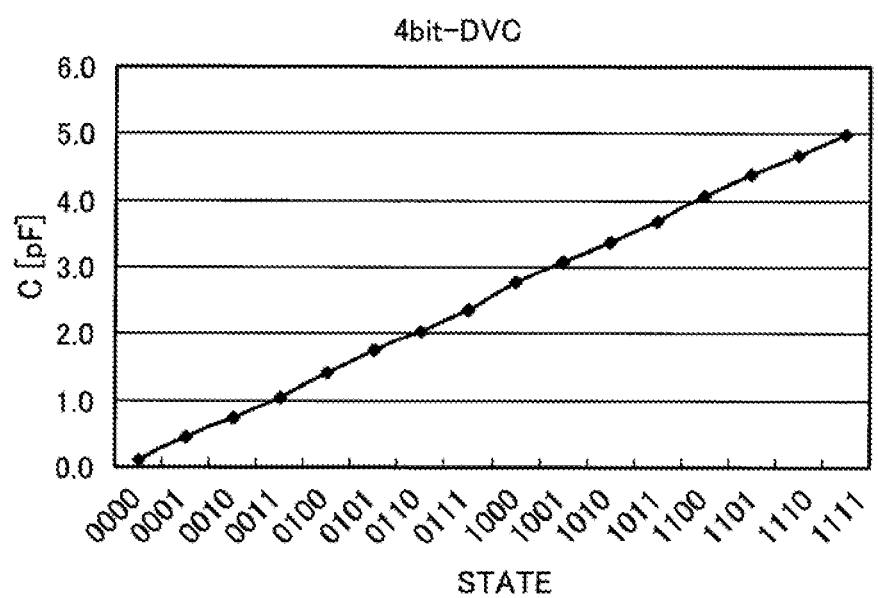
FIG. 7 illustrates an example of the state of each bit and a capacitance value in the variable capacitance circuit.

FIG. 7 illustrates an example of the state of each bit and a capacitance value in the variable capacitance circuit. In FIG. 7, a horizontal axis indicates the state of each bit and a vertical axis indicates a capacitance value C (pF) of the variable capacitance circuit 50.

For example, a capacitance value C at the time of the state "0000" is the capacitance value of the variable capacitance circuit 50 in which the capacitance values of all the variable capacitance elements C5a, C6a, C7a, and C8a are the OFF-state capacitance values. A capacitance value C at the time of the state "0001" is the capacitance value of the variable capacitance circuit 50 in which the capacitance values of the variable capacitance elements C5a, C6a, and C7a are the OFF-state capacitance values and in which the capacitance value of the variable capacitance element C8a is the ON-state capacitance value.

With the variable capacitance circuit 50 illustrated in FIG. 6, the capacitance values of the fixed capacitance elements C5b, C5c, C6b, C6c, C7b, C7c, C8b and C8c are set to the following values. By doing so, as illustrated in FIG. 7, the property of the differential AC between capacitance values corresponding to adjacent states being constant is obtained.

In order to obtain the property illustrated in FIG. 7, the capacitance values of the fixed capacitance elements C5b and C5c are set to 12.0 (pF) and the capacitance values of the fixed capacitance elements C6b and C6c are set to 1.2 (pF). Furthermore, the capacitance values of the fixed capacitance elements C7b and C7c are set to 0.4 (pF) and the capacitance values of the fixed capacitance elements C8b and C8c are set to 0.2 (pF).

As stated above, the capacitance values of the fixed capacitance elements C5b and C5c included in the variable capacitance section 52-1 which specifies a capacitance value of the MSB are 12.0 (pF) and are larger than those of the fixed capacitance elements C6b and C6c, C7b and C7c, and C8b and C8c included in the other variable capacitance sections 52-2 through 52-4 respectively. As a result, the electrode area of the fixed capacitance elements C5b and C5c is large.

If these capacitance values are set, the capacitance value $C_{MSBon}$ (pF) of the variable capacitance section 52-1 obtained in the case of the capacitance value of the variable capacitance element C5a being the ON-state capacitance value (3.0 (pF)) is given by $$1/C_{MSBon}=(1/3)+(1/(2\times 12.0)) \qquad (2)$$

Accordingly, $C_{MSBon}=8/3$ (pF).

Figure 8:
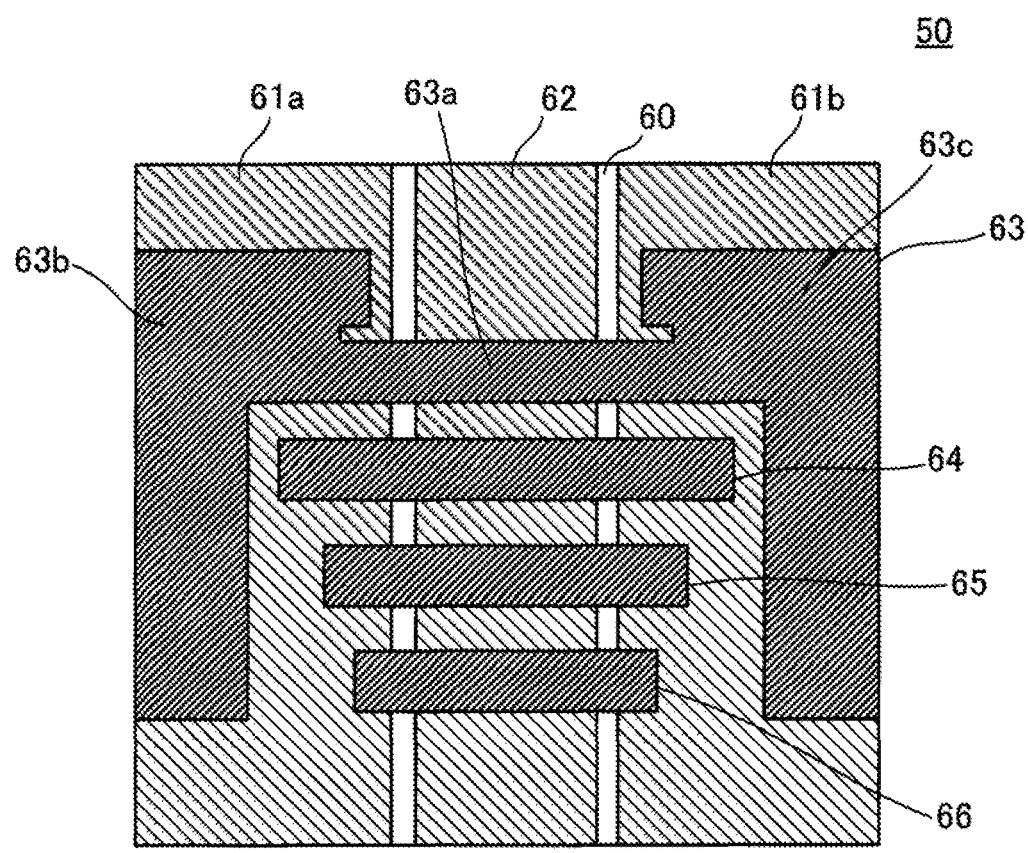
FIG. 8 is a plan view of an example of the variable capacitance circuit in which each of variable capacitance sections that specify capacitance values of all bits includes one variable capacitance element.

FIG. 8 is a plan view of an example of the variable capacitance circuit in which each of variable capacitance sections that specify capacitance values of all bits includes one variable capacitance element.

In the variable capacitance circuit 50, ground layers 61a and 61b and a signal line 62 are formed over a substrate 60. Furthermore, electrodes 63, 64, 65, and 66 are formed so that they will extend over the signal line 62.

The electrode 63 belongs to the variable capacitance section 52-1 illustrated in FIG. 6, the electrode 64 belongs to the variable capacitance section 52-2 illustrated in FIG. 6, the electrode 65 belongs to the variable capacitance section 52-3 illustrated in FIG. 6, and the electrode 66 belongs to the variable capacitance section 52-4 illustrated in FIG. 6.

Each of the electrodes 63 through 66 has a shape like a bridge. This is the same with the electrode 23 illustrated in FIG. 3. Both edge portions of each of the electrodes 63 through 66 are fixed to the ground layers 61a and 61b with dielectrics (not illustrated) therebetween. The fixed capacitance elements C5b and C5c, C6b and C6c, C7b and C7c, and C8b and C8c included in the variable capacitance sections 52-1 through 52-4 illustrated in FIG. 6 are realized by both edge portions of the electrodes 63 through 66, respectively, the dielectrics, and the ground layers 61a and 61b.

As illustrated in FIG. 8, of the electrode 63 which belongs to the variable capacitance section 52-1 that specifies a capacitance value of the MSB, the electrode area of fixed electrode portions 63b and 63c which elastically support a movable electrode portion 63a is large.

As illustrated in FIG. 1, on the other hand, the variable capacitance section 12-1 of the variable capacitance circuit 10 which specifies a capacitance value of the MSB includes the two variable capacitance elements C1a and C1b. It is assumed that the fixed capacitance elements C2b and C2c, C3b and C3c, and C4b and C4c included in the variable capacitance sections 12-2 through 12-4 are equal in capacitance value to the fixed capacitance elements C6b and C6c, C7b and C7c, and C8b and C8c included in the variable capacitance sections 52-2 through 52-4 respectively. Furthermore, it is assumed that an ON-state capacitance value and an OFF-state capacitance value of each of the variable capacitance elements C1a, C1b, C2a, C3a, and C4a are 3.0 pF and 0.03 pF respectively. In this case, capacitance values Cx of the fixed capacitance elements C1c and C1d required for obtaining the property illustrated in FIG. 7 are find from $$1/C_{MSBon}=(1/(2\times 3))+(1/2 Cx) \qquad (3)$$

where $C_{MSBon}$ is a capacitance value (pF) of the variable capacitance section 52-1 obtained in the case of the capacitance value of the variable capacitance element C5a being the ON-state capacitance value (3.0 (pF)).

In order to obtain the property illustrated in FIG. 7 in the variable capacitance circuit 10, the capacitance value of the variable capacitance section 12-1 is made equal to the capacitance value ($C_{MSBon}$) of the variable capacitance section 52-1. Accordingly, $C_{MSBon}=8/3$ (pF) found from expression (2) is substituted in expression (3) and Cx=2.4 (pF) is obtained.

That is to say, the capacitance values of the fixed capacitance elements C1c and C1d included in the variable capacitance circuit 10 are one fifth of the capacitance values of the fixed capacitance elements C5b and C5c included in the variable capacitance circuit 50 (=2.4/12.0).

Therefore, as illustrated in FIG. 2, electrode area is small compared with the case where each of the variable capacitance sections which specify capacitance values of all the bits includes one variable capacitance element (FIGS. 6 and 8). This leads to a reduction in circuit area. The reason for this is that a reduction in the electrode area of the fixed capacitance elements exceeds an increase in electrode area caused by adding one variable capacitance element.

In addition, the capacitance values of the fixed capacitance elements C1c and C1d become smaller, so equivalent series resistance (ESR) becomes lower. Accordingly, quality factors of the fixed capacitance elements C1c and C1d are improved. As a result, a quality factor of the entire variable capacitance circuit 10 is improved.

Furthermore, changing the electrode 63 having the shape illustrated in FIG. 8 to the electrode 23 having the shape illustrated in FIG. 2 is realized only by changing masks. That is to say, there is no need to add a new process. This checks an increase in production costs.

In addition, the difference in capacitance between the fixed capacitance element FC1 included in the variable capacitance section 12-1 which specifies a capacitance value of the MSB and the fixed capacitance element FC4 included in the variable capacitance section 12-4 which specifies a capacitance value of the LSB is small. Accordingly, it is easy to secure a process margin, and stable characteristics are obtained.

In the above description the 4-bit variable capacitance circuit 10 is taken as an example. However, the same applies to a multi-bit variable capacitance circuit such as a 9- or 10-bit variable capacitance circuit. For example, a multi-bit variable capacitance circuit may include a variable capacitance section which specifies a capacitance value of a MSB and which includes three variable capacitance elements and a variable capacitance section which specifies a capacitance value of a bit one bit lower than the MSB and which includes two variable capacitance elements.

EXAMPLE

Figure 9:
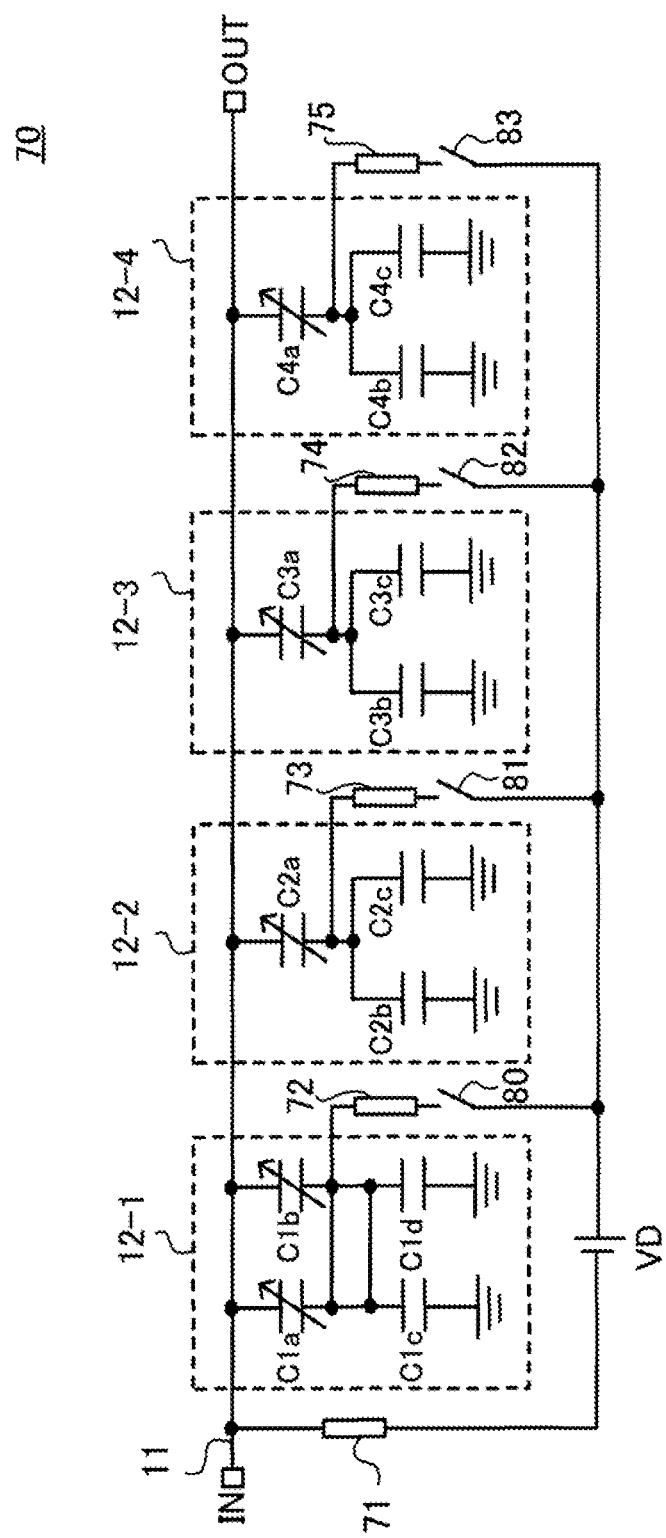
FIG. 9 illustrates an example of a variable capacitance circuit to which an RF signal is inputted.

FIG. 9 illustrates an example of a variable capacitance circuit to which a radio frequency (RF) signal is inputted. Components in FIG. 9 which are the same as those illustrated in FIG. 1 are marked with the same numerals.

With a variable capacitance circuit 70, a RF signal is inputted from an input terminal IN connected to one end of a signal line 11 and the RF signal is outputted from an output terminal OUT connected to the other end of the signal line 11.

As stated above, one end of each of variable capacitance elements C1a and C1b, C2a, C3a, and C4a which belong to variable capacitance sections 12-1 through 12-4, respectively, is connected to the signal line 11 between the input terminal IN and the output terminal OUT.

A node between the input terminal IN and the variable capacitance section 12-1 is connected to a negative side of a power supply VD via a RF block 71. A positive side of the power supply VD is connected to the other end of each of the variable capacitance elements C1a and C1b via a switch 80 and a RF block 72. Furthermore, the positive side of the power supply VD is connected to the other end of the variable capacitance element C2a via a switch 81 and a RF block 73, is connected to the other end of the variable capacitance element C3a via a switch 82 and a RF block 74, and is connected to the other end of the variable capacitance element C4a via a switch 83 and a RF block 75. Each of the RF blocks 71 through 75 includes, for example, a resistor or an inductor and prevents a RF signal from flowing to the power supply VD side.

When the switches 80 through 83 are on, driving voltage is applied to the variable capacitance elements C1a, C1b, C2a, C3a, and C4a by the power supply VD and the variable capacitance elements C1a, C1b, C2a, C3a, and C4a have ON-state capacitance values. On the other hand, when the switches 80 through 83 are off, the supply of driving voltage to the variable capacitance elements C1a, C1b, C2a, C3a, and C4a is shut off and the variable capacitance elements C1a, C1b, C2a, C3a, and C4a have OFF-state capacitance values.

For example, the switches 80 through 83 are controlled from outside the variable capacitance circuit 70. In addition, the switches 80 through 83, the RF blocks 71 through 75, and the power supply VD themselves may be outside the variable capacitance circuit 70.

A bit state like that illustrated in FIG. 7 is selected according to a desired capacitance value and the switches 80 through 83 are turned on or off.

If a capacitance value is set to, for example, about 2.0 (pF), then the state "0110" is selected as illustrated in FIG. 7. Accordingly, the switches 80 and 83 are turned off and the switches 81 and 82 are turned on. If a capacitance value is set to about 5.0 (pF), then the state "1111" is selected as illustrated in FIG. 7. Accordingly, all the switches 80 through 83 are turned on.

As stated above, with the variable capacitance circuit 70 the variable capacitance section 12-1, of the variable capacitance sections 12-1 through 12-4, includes the two variable capacitance elements C1a and C1b.

Accordingly, it is possible to make the capacitance values of fixed capacitance elements C1c and C1d small and to reduce circuit area.

Impedance Matching Circuit

Figure 10:
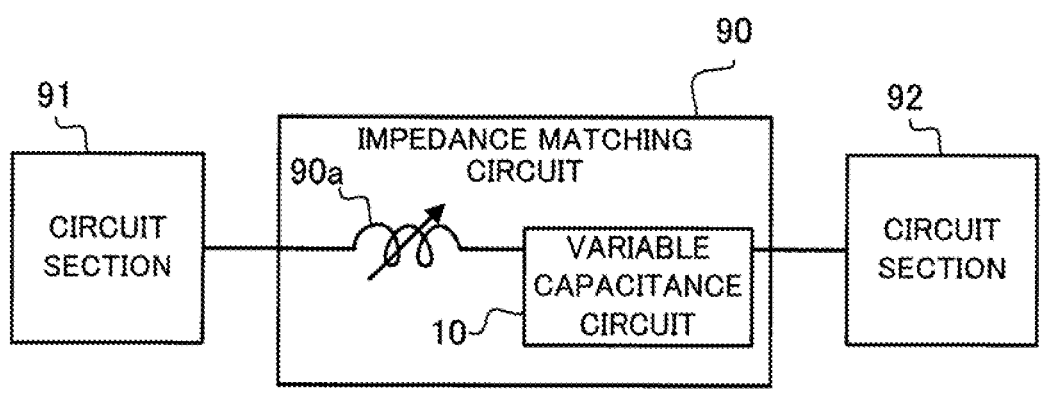
FIG. 10 illustrates an example of an impedance matching circuit using the variable capacitance circuit according to the embodiment.

FIG. 10 illustrates an example of an impedance matching circuit using the variable capacitance circuit according to the embodiment.

An impedance matching circuit 90 is connected between circuit sections 91 and 92 and performs impedance matching so as to efficiently transmit a signal between the circuit sections 91 and 92. The impedance matching circuit 90 includes a variable inductance 90a and a variable capacitance circuit 10 like that illustrated in FIG. 1 (or a variable capacitance circuit 70 like that illustrated in FIG. 9). Capacitance and inductance are changed by the impedance matching circuit 90 having the above structure. By doing so, impedance is changed to perform impedance matching.

By applying the variable capacitance circuit 10 according to the embodiment to the impedance matching circuit 90, circuit area is reduced.

In addition, with a RF frond-end circuit, a variable antenna, a variable filter, and the like using the above impedance matching circuit 90, circuit area is also reduced.

According to the disclosed variable capacitance circuit and impedance matching circuit, circuit area is reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A variable capacitance circuit comprising:
a first variable capacitance section including:
a plurality of first variable capacitance elements connected to a signal line and each having a first capacitance value that can be changed between a first value and a second value greater than the first value according to a driving voltage; and
a first fixed capacitance element connected in series with the plurality of first variable capacitance elements; and
a second variable capacitance section including:
one or more second variable capacitance elements connected to the signal line and having a second capacitance value that can be changed between the first value and the second value according to the driving voltage, a number of the one or more second variable capacitance elements being fewer than a number of the plurality of first variable capacitance elements; and
a second fixed capacitance element connected in series with the one or more second variable capacitance elements.

2. The variable capacitance circuit according to claim 1, wherein:
the variable capacitance circuit obtains capacitance values in a determined range with n-bit resolution and includes n variable capacitance sections that specify capacitance values of n bits;
at least a variable capacitance section which specifies a capacitance value of a most significant bit is the first variable capacitance section including the plurality of first variable capacitance elements and the first fixed capacitance element; and
at least one of variable capacitance sections which specify capacitance values of other bits is the second variable capacitance section including the one or more second variable capacitance elements and the second fixed capacitance element.

3. The variable capacitance circuit according to claim 1, wherein a plurality of movable electrode portions of the plurality of first variable capacitance elements are elastically supported by fixed electrode portions of the first fixed capacitance element.

4. The variable capacitance circuit according to claim 1, wherein the plurality of first variable capacitance elements included in the first variable capacitance section are driven at same time by the same driving voltage.

5. The variable capacitance circuit according to claim 1, wherein a plurality of movable electrode portions of the plurality of first variable capacitance elements included in the first variable capacitance section have a same spring constant.

6. The variable capacitance circuit according to claim 1, wherein distances between a plurality of movable electrode portions of the plurality of first variable capacitance elements included in the first variable capacitance section and a fixed electrode with a dielectric therebetween are the same.

7. The variable capacitance circuit according to claim 1, wherein facing areas of a plurality of movable electrode portions of the plurality of first variable capacitance elements included in the first variable capacitance section and a fixed electrode with a dielectric therebetween are the same.

8. The variable capacitance circuit according to claim 1, wherein each of the plurality of first variable capacitance elements has a first terminal and a second terminal, the first terminal being connected to the signal line, the first fixed capacitance element has a third terminal and a fourth terminal, the third terminal being connected to the second terminal of said each of the plurality of first variable capacitance elements, the fourth terminal being grounded, each of the one or more second variable capacitance elements has a fifth terminal and a sixth terminal, the fifth terminal being connected to the signal line, and the second fixed capacitance element has a seventh terminal and an eighth terminal, the seventh terminal being connected to the sixth terminal of said each of the one or more second variable capacitance elements, the eighth terminal being grounded.

9. An impedance matching circuit comprising:
a variable capacitance circuit including:
  a first variable capacitance section including:
    a plurality of first variable capacitance elements connected to a signal line and each having a first capacitance value that can be changed between a first value and a second value greater than the first value according to a driving voltage; and
    a first fixed capacitance element connected in series with the plurality of first variable capacitance elements; and
  a second variable capacitance section including:
    one or more second variable capacitance elements connected to the signal line and having a second capacitance value that can be changed between the first value and the second value according to the driving voltage, a number of the one or more second variable capacitance elements being fewer than a number of the plurality of first variable capacitance elements; and
    a second fixed capacitance element connected in series with the one or more second variable capacitance elements; and
a variable inductance connected to the signal line and the variable capacitance circuit.

10. The impedance matching circuit according to claim 9, wherein each of the plurality of first variable capacitance elements has a first terminal and a second terminal, the first terminal being connected to the signal line, the first fixed capacitance element has a third terminal and a fourth terminal, the third terminal being connected to the second terminal of said each of the plurality of first variable capacitance elements, the fourth terminal being grounded, each of the one or more second variable capacitance elements has a fifth terminal and a sixth terminal, the fifth terminal being connected to the signal line, and the second fixed capacitance element has a seventh terminal and an eighth terminal, the seventh terminal being connected to the sixth terminal of said each of the one or more second variable capacitance elements, the eighth terminal being grounded.

\* \* \* \* \*